United States Patent [19]
Ohga et al.

[11] Patent Number: 5,389,925
[45] Date of Patent: Feb. 14, 1995

[54] A/D AND D/A CONVERSION DEVICE WITH SHARED PARAMETER GENERATORS

[75] Inventors: Tetsuaki Ohga; Hiroichi Ishida; Takeshi Tokuda, all of Hyogo, Japan

[73] Assignee: Mitsubishi Denki Kabushiki Kaisha, Tokyo, Japan

[21] Appl. No.: 537,954

[22] Filed: Jun. 13, 1990

[30] Foreign Application Priority Data

Jul. 7, 1989 [JP] Japan .................................. 1-176445

[51] Int. Cl.⁶ .......................................... H03M 1/00
[52] U.S. Cl. .................................. 341/108; 364/724.1
[58] Field of Search ................. 341/108, 110, 76, 143; 364/720, 724, 724.1; 375/122

[56] References Cited

U.S. PATENT DOCUMENTS

| | | | |
|---|---|---|---|
| 4,160,243 | 7/1979 | Moriya et al. | 340/347 C |
| 4,167,731 | 9/1979 | Eggermont | 341/76 |
| 4,222,077 | 9/1980 | Yamada | 341/110 |
| 4,270,026 | 5/1981 | Shenoi et al. | 364/724.1 |
| 4,302,631 | 11/1981 | Shenoi et al. | 364/724.1 |
| 4,425,665 | 1/1984 | Stauffer | 375/9 |
| 4,584,659 | 4/1986 | Stikvoort | 364/724.1 |
| 4,809,208 | 2/1989 | Hansen et al. | 364/724.12 |
| 4,835,723 | 5/1989 | Hansen | 364/724.01 |
| 4,860,012 | 8/1989 | Rich et al. | 341/143 |
| 4,864,526 | 9/1989 | Dyer | 364/724.1 |
| 4,881,191 | 11/1989 | Morton | 364/724.1 |
| 4,996,528 | 2/1991 | Asghar et al. | 341/110 |

FOREIGN PATENT DOCUMENTS 3203012 8/1983 Germany ................. 341/110

OTHER PUBLICATIONS

Rabiner et al., "A Novel Implementation For Narrow-Band FIR Dig'l Filters", Oct. 75, IEEE Transactions on Acoustics, Speech, & Signal Processing, vol. 23, No. 5, pp. 457–464.

A. Yukawa, "AD/DA Conversion Based on Over-Sampling Methods", No. 4, Nikkei Electronics, No. 458, pp. 223–231, Oct. 17, 1988.

A. Yukawa, "AD/DA Conversion Based on Over Sampling Methods", No. 5, Nikkei Electronics, No. 459, pp. 233–239, Oct. 31, 1988.

*Primary Examiner*—Howard L. Williams
*Attorney, Agent, or Firm*—Rothwell, Figg, Ernst & Kurz

[57] ABSTRACT

The inventive A/D and D/A conversion device replaces the conventional parameter generators, which are provided in pairs for supplying same filter parameters to the decimation and interpolation digital filters respectively, with a single parameter generator, thereby having the number of parameter generators and reducing the scale of circuit.

4 Claims, 3 Drawing Sheets

5,389,925

A/D AND D/A CONVERSION DEVICE WITH SHARED PARAMETER GENERATORS

BACKGROUND OF THE INVENTION

1. Field of the Invention

The present invention relates to an A/D and D/A conversion device having an A/D conversion section and a D/A conversion section, each using a digital filter.

2. Description of the Prior Art

FIG. 1 is a block diagram showing a conventional A/D and D/A conversion device, in which indicated by 1 is an A/D conversion section and 2 is a D/A conversion section. Indicated by 3 is an analog input signal to the A/D conversion section 1, 4 is a digital output signal from the A/D conversion section 1, 5 is a digital input signal to the D/A conversion section 2, and 6 is an analog output signal from the D/A conversion section 2.

First, the internal arrangement of the A/D conversion section 1 will be explained.

Indicated by 7 is an A/D converter based on the oversampling scheme, which converts the analog input signal 3 into a digital signal 8 of a sampling frequency $f_{s1}$ that is N times the maximum frequency $f_m$ of the signal band. The $f_{s1}$ is assumed to be large enough as compared with the $f_m$. Indicated by 9 is a first decimation filter which converts the digital signal 8 of $f_{s1}$ into a digital signal 10 of a sampling frequency $f_{s2}$ that is M times the maximum frequency $f_m$ and, at the same time, eliminates foldover noise created by the conversion. M is a number smaller than N.

Indicated by 17 is a parameter generator which determines the characteristics of the first decimation filter 9, and 11 is a second decimation filter which converts the digital signal 10 into the digital output signal 4 of a sampling frequency $f_{s3}$ that is K times the maximum frequency $f_m$ and, at the same time, eliminates aliasing noise created by the conversion. K is a number smaller than M. Indicated by 18 is a parameter generator which determines the characteristics of the second decimation filter 18.

Next, the internal arrangement of the D/A conversion section 2 will be explained.

Indicated by 16 is a first interpolation filter which converts a digital input signal 5 of the sampling frequency $f_{s3}$ into a digital signal of the sampling frequency $f_{s2}$ and, at the same time, eliminates image components created by the conversion, 20 is a parameter generator which determines the characteristics of the first interpolation filter 16, 1.4 is a second interpolation filter which converts the digital signal 15 into a digital signal 13 of the sampling frequency $f_{s1}$ and, at the same time, eliminates image components created by the conversion, 19 is a parameter generator which determines the characteristics of the second interpolation filter 14, and 12 is a D/A converter based the oversampling scheme which converts the digital signal 13 into the analog output signal 6.

The first and second decimation filters 9 and 11, and the first and second interpolation filters 16 and 14 are formed of digital filters.

Next, the operation will be explained, beginning with the A/D conversion section 1.

The analog input signal 3 entered to the A/D conversion section 1 is converted into a digital signal 8 of a very high sampling frequency $f_{s1}$, which is N times the maximum frequency $f_m$ of the signal band, by means of the oversampling A/D converter 7. However, the $f_{s1}$ is too high for use as the sampling frequency, and it needs to be converted to a lower sampling frequency $f_{s3}$.

Although this sampling frequency conversion operation is merely to output one out of every $f_{s1}/f_{s3}$ data items at the most (i.e., decimation), simple decimation causes the aliasing noise, resulting in a significant deterioration of the signal quality. Therefore, the signal is fed through a digital filter so as to remove the noise before decimation. The digital filter needs to meet the following two conditions.

(a) It has a sufficient attenuation in the frequency range ($I \times f_{s3} \pm f_m$, where I is a positive integer) in which the noise exists, thereby preventing the aliasing noise.

(b) It has as flat transmission characteristics as possible within the signal band.

It is very difficult to accomplish such filter characteristics by using a single-stage digital filter, because of the difference between the Nyquist frequency ($f_s/2$) of the input signal from the maximum frequency $f_m$ of the signal band. On this account, it is a general convention to configure the digital filter in two stages made up of a first decimation filter 9 and a second decimation filter 11.

FIG. 1 is an example of the case where the digital filter is formed in two stages for the conversion of the sampling frequency. The digital signal 8 is fed through the first decimation filter 9 at a sampling frequency of $f_{s1}$ so that data is decimated, and it is converted into a digital signal 10 of an intermediate sampling frequency $f_{s2}$. After that, the second decimation filter 11 having more higher accuracy is used to eliminate noises remaining in the range of signal band, and data is decimated up to the final sampling frequency $f_{s3}$. The first and second decimation filters 9 and 11 have their characteristics determined by the parameters provided by the respective parameter generators 17 and 18.

Next, the D/A conversion section 2 will be explained.

The D/A conversion section 2 has basically the reverse operation against the A/D conversion section 1. The A/D conversion section 1 performs the sampling frequency conversion through the decimation from $f_{s1}$ to $f_{s3}$, whereas the D/A conversion section 2 performs the sampling frequency conversion inversely through the interpolation from $f_{s3}$ to $f_{s1}$. When the sampling frequency is converted from $f_{s3}$ to $f_{s1}$ by the D/A conversion section, the signal is fed through a digital filter so as to remove noises outside the range of signal band, as in the case of the A/D conversion section 1. The digital filter (interpolation filter) needs to meet the following two conditions.

(c) It has a sufficient attenuation in the frequency range ($I \times f_{s3} \pm f_m$, where I is a positive integer) in which the image noise exists, thereby eliminating the image noise created by interpolation.

(d) It has as flat transmission characteristics as possible within the signal band.

Since the conditions (c) and (d) are virtually identical to the conditions (a) and (b) of the foregoing decimation filter, the interpolation filter is formed of two-stage digital filters having completely same characteristics as of the decimation filter.

The digital input signal 5 of a sampling frequency $f_{s3}$ is first converted into a digital signal 15 of a sampling frequency $f_{s2}$ through the interpolation by the first interpolation filter 16. Subsequently, the digital signal 15 is converted into a digital signal 13 of a sampling frequency $f_{s1}$ through the interpolation by the second interpolation filter 14, and thereafter is eliminated the image noise to output the digital signal 13. The digital signal 13 of a sampling frequency $f_{s1}$ is converted into an analog output signal 6 by the oversampling D/A converter 12, and it is output from the D/A conversion section 2.

The conventional A/D and D/A conversion device is arranged as described above, and it necessitates four-stage digital filters, each including a parameter generator and a multiplier for the multiplication between the parameter and data, resulting in a considerably large circuit scale of the device as the whole.

The foregoing prior art is described in the article entitled "A-D/D-A Conversion Technique Based on Oversampling Scheme", in publication Nikkei Electronics, No. 458, pp. 223–231, Oct. 17, 1988, for example.

SUMMARY OF THE INVENTION

The present invention is intended to overcome the foregoing problem, and its object is to provide an A/D and D/A conversion device which can be configured in a smaller circuit scale.

In order to achieve the above object, the inventive A/D and D/A conversion device is designed to share two parameter generators between the A/D conversion section and D/A conversion section, by reason of the same filtering characteristics of pairs of digital filters in both sections.

These and other objects and nobel features of the present invention will become more apparent from the following detailed description taken in conjunction with the accompanying drawings. The drawings are solely intended for the explanatory purpose, and they do not limit the scope of the invention.

DETAILED DESCRIPTION OF THE PREFERRED EMBODIMENTS

The following describes illustrated embodiments of the present invention.

Figure 1:
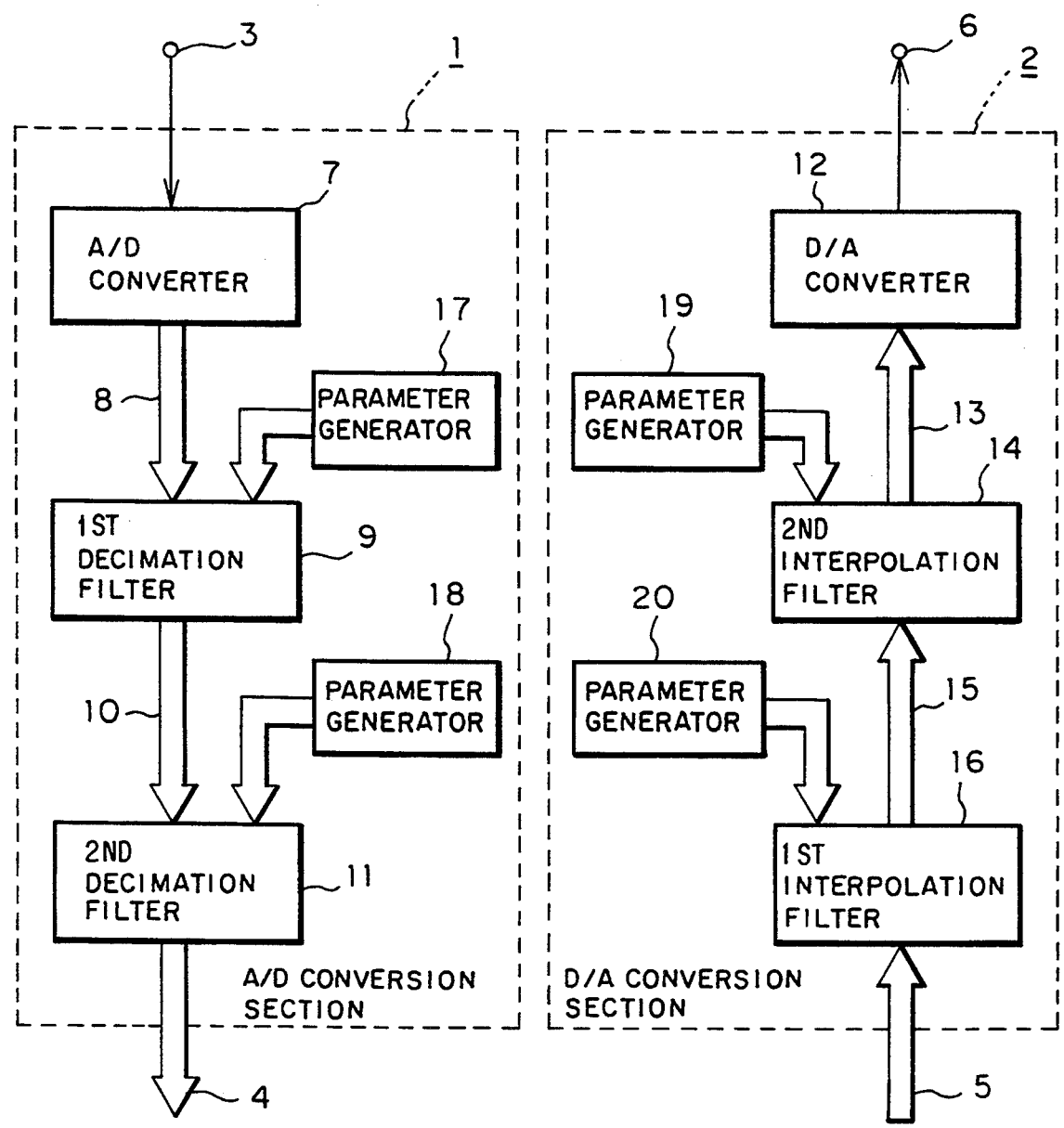
FIG. 1 is a block diagram showing the conventional A/D and D/A conversion device.
Figure 2:
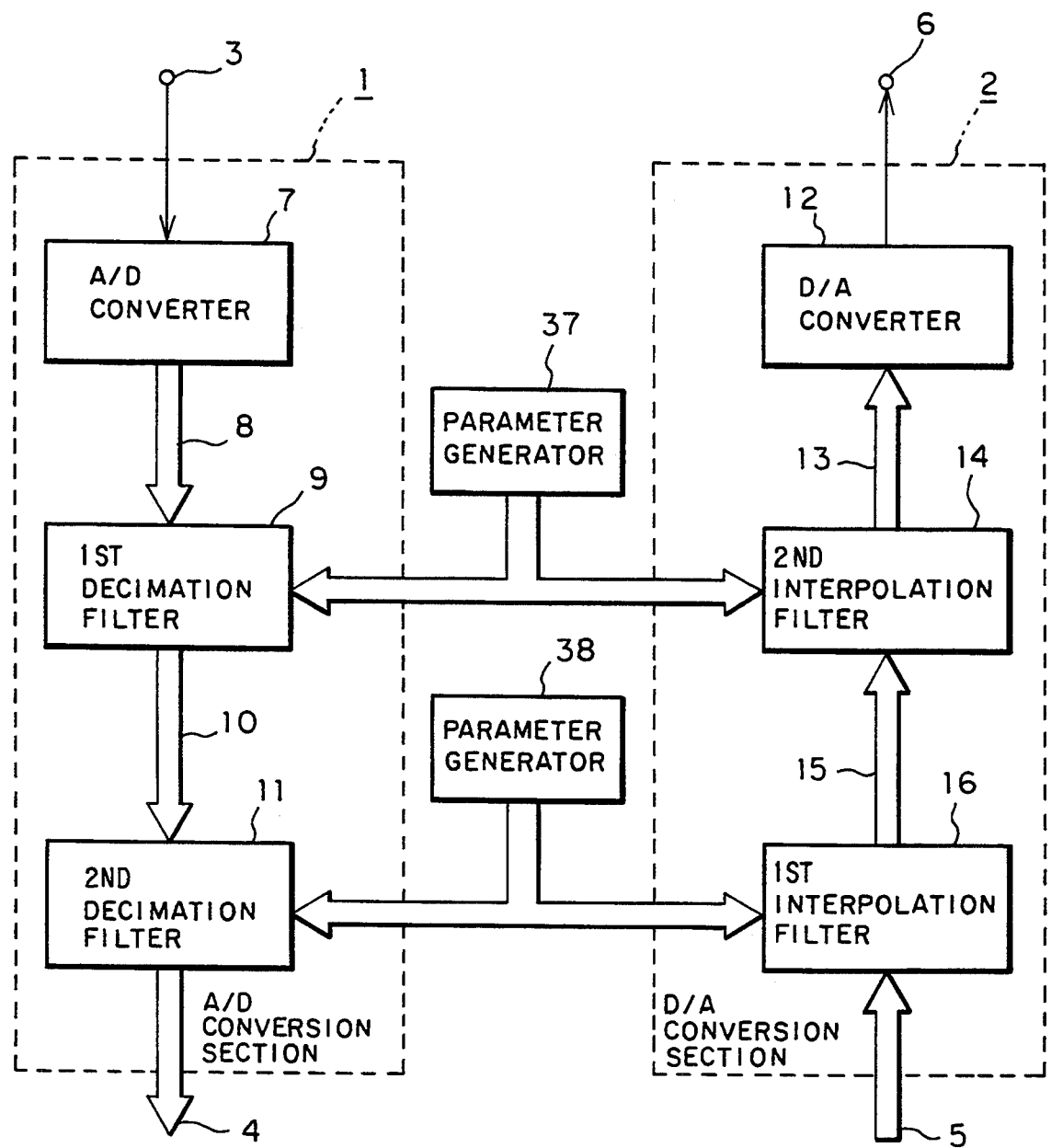
FIG. 2 is a block diagram showing an A/D and D/A conversion device according to an embodiment of the present invention.

In FIG. 2, components 1 through 16 are identical or equivalent to those with the same symbols in FIG. 1. Indicated by 37 is a parameter generator which provides filtering parameters for the first decimation filter 9 and the second interpolation filter 14, and 38 is a parameter generator which provides filtering parameters for the second decimation filter 11 and the first interpolation filter 16.

Next, the operation will be explained.

This embodiment differs from the conventional arrangement of FIG. 1 in that the two parameter generators 17 and 19 in FIG. 1 are configured as a single parameter generator 37 in FIG. 2, and that the two parameter generators 18 and 20 in FIG. 1 are configured as a single parameter generator 38 in FIG. 2.

Based on that the digital filter in the A/D conversion section 1 and the digital filter in the D/A conversion section 2 have the completely same characteristics, and that the digital filters have their characteristics determined by the parameter values generated by the parameter generators, the parameter generators 17 and 19 in FIG. 1 produce the same parameter value and the parameter generators 18 and 20 produce the same parameter value. Namely, the first decimation filter 9 and second interpolation filter 14 in FIG. 2 and FIG. 1 have the same filtering characteristics, and the second decimation filter 11 and first interpolation filter 16 have the same filtering characteristics. By utilization of this fact, the present invention is designed to share the parameter generators 37 and 38 among these filters.

Although the above embodiment has the parameter generators 37 and 38 shared by the A/D conversion section 1 and D/A conversion section 2, the arrangement may be made to share such circuit components as multipliers and adder-subtracters, which are provided separately for each digital filter conventionally, besides the parameter generators, thereby accomplishing the reduction of circuit scale as in the foregoing embodiment.

Figure 3:
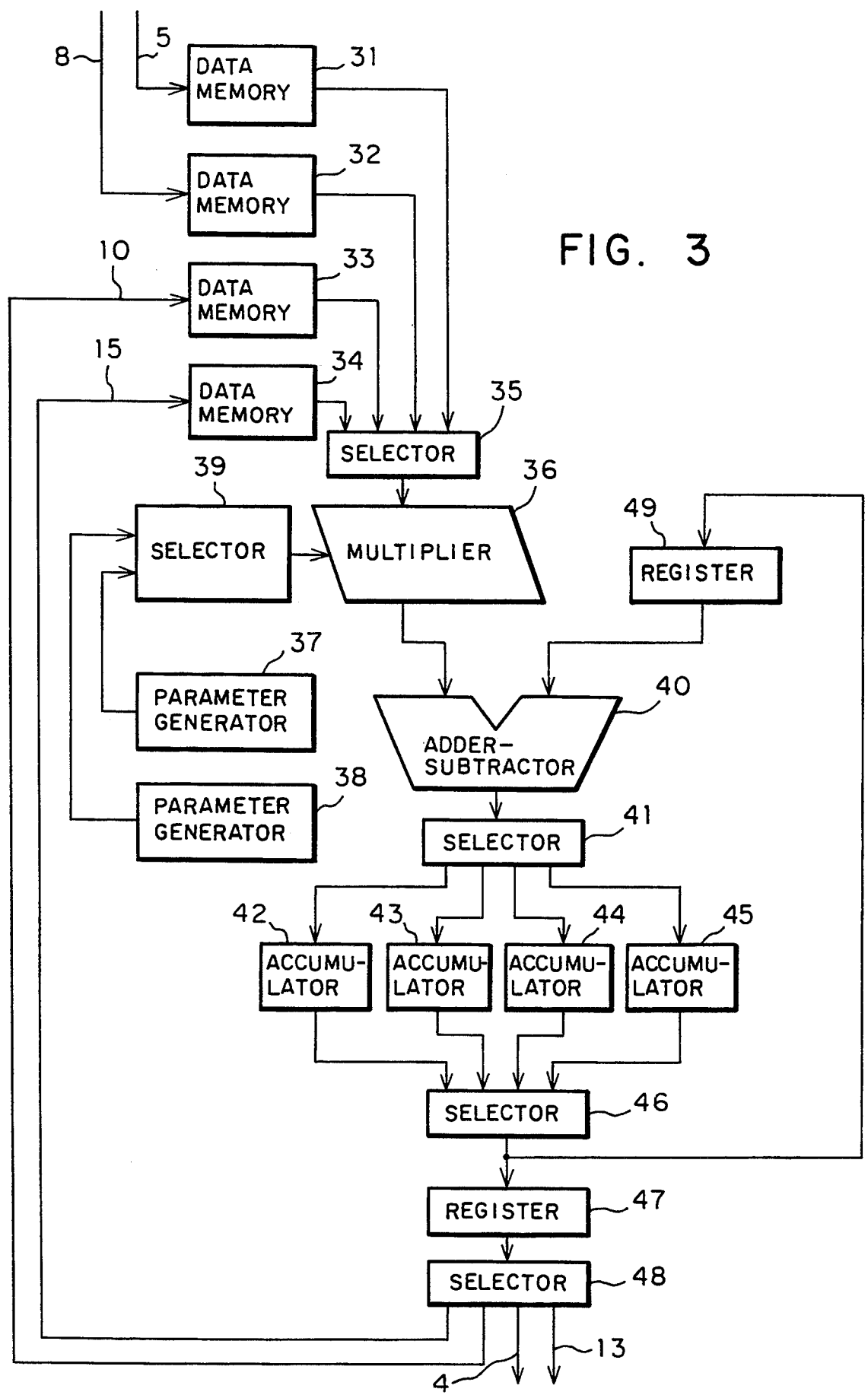
FIG. 3 is a block diagram showing the digital filter shared between decimation and interpolation in the A/D and D/A conversion device according to another embodiment of the present invention.

FIG. 3 shows the arrangement of the digital filter according to another embodiment of the present invention based on the above-mentioned design scheme. In the figure, components and signals indicated by 5, 8, 4, 13, 10, 15, 37, and 38 are identical or equivalent to those indicated by the common symbols in FIG. 1 and FIG. 2.

In FIG. 3, indicated by 31, 32, 33 and 34 are data memories for storing data for the digital filters. Among these, 31 is a data memory for the first interpolation filter, 32 is a data memory for the first decimation filter, 33 is a data memory for the second decimation filter, and 34 is a data memory for the second interpolation filter. Indicated by 35 is a selector which selects one of the data memories 31–34, 37 is a parameter generator shared by the first decimation filter and the second interpolation filter, 38 is a parameter generator shared by the second decimation filter and the first interpolation filter, 39 is a selector for selecting the parameter generator 37 or 38, 36 is a multiplier which multiplies data by a parameter respectively selected by the selectors 35 and 39, 40 is an adder-subtracter which accumulates products provided by the multiplier 36, 41 is a selector which selects one of four latter-stage accumulators 42–45 for storing sums provided by the adder-subtracter 40, 42 is an accumulator for temporarily holding the intermediate result of computation by the first decimation filter, 43, 44 and 45 are similar accumulators, of which 43 is for the second decimation filter, 44 is for the first interpolation filter, and 45 is for the second interpolation filter. Indicated by 46 is a selector for selecting an accumulator which contains data used for the next computation, and 47 is a register which delivers the output data to the next stage as a filter output after a certain number of product summations for the data held in the accumulators 42–45 have completed thereby to yield the digital filter output. Indicated by 48 is a selector which selects a process to be implemented for the signal released from the register 47, and 49 is a register which latches an operand for the adding-subtracting operation in the adder-subtracter 40.

According to the foregoing arrangement, the multiplier 36 and adder-subtracter 40 can be shared by the four digital filters by use of the selectors.

As described above, according to the present invention, parameter generators, which have conventionally been provided separately for individual digital filters in the D/A conversion section and A/D conversion section, can be shared by digital filters having the same parameter characteristics, whereby the circuit scale of the device can be reduced.

What is claimed is:

1. An A/D and D/A conversion device having A/D conversion means for converting analog signals to digital signals including an A/D converter which produces a $f_s$ digital signal by sampling an externally supplied analog signal at a predetermined frequency $f_s$, decimation filters of n stages (n is a positive integer) which produces a $f_d$ digital signal by decimating said $f_s$ signal supplied by the A/D converter at a predetermined frequency $f_d$ that is lower than said frequency $f_s$, said n stages of decimation filters being arranged sequentially in i stages in the direction of information flow where i increases by whole integers from 1 to n, and D/A conversion means for converting digital signals to analog signals including interpolation filters of n stages (n is a positive integer) which produces a $f_s$ digital signal by interpolating an externally supplied input digital signal of a sampling frequency $f_d$ at the frequency $f_s$, said n stages of interpolation filters being arranged sequentially in i stages in the direction of information flow where i increases by whole integers from 1 to n, and a D/A converter which converts said $f_s$ digital signal supplied by said interpolation filters into an analog signal to output, said A/D and D/A conversion device comprising:

parameter generators of n in number, each connected to be shared by and for supplying the same filter parameters to both the i-th stage (i=1 to n) of said n-stage decimation filters and, at the same time, to the (n−i+1)th stage of said n-stage interpolation filters.

2. An A/D and D/A conversion device according to claim 1, wherein said number n is two.

3. An A/D and D/A conversion device having A/D conversion means for converting analog signals to digital signals including an A/D converter which produces a $f_s$ digital signal by sampling an externally supplied analog signal at a predetermined frequency $f_s$, and which produces a $f_d$ digital signal by decimation filtering of said $f_s$ signal supplied by the A/D converter at a predetermined frequency $f_d$ that is lower than said frequency $f_s$, D/A conversion means for converting digital signals to analog signals which produces a $f_s$ digital signal by interpolation filtering of an externally supplied input digital signal of the sampling frequency $f_d$ at the frequency $f_s$, and a D/A converter which converts said $f_s$ digital signal supplied by said interpolation filters into an analog signal to output, said A/D and D/A conversion device comprising:

a single, multistage, common filter including both decimation filter means and interpolation filter means for performing said decimation filtering and said interpolation filtering, and parameter generators each connected to be shared by and for supplying the same filter parameters to selected stages of each of said decimation filter means and said interpolation filter means at the same time.

4. An A/D and D/A conversion device according to claim 3, wherein said single, multistage, common filter comprises computation means for performing decimation and interpolation functions, data storage means for storing data to be filtered, and data selection means for selecting from said data storage means specific data to be filtered.

* * * * *